(12) United States Patent
Guo et al.

(10) Patent No.: US 9,590,231 B2
(45) Date of Patent: Mar. 7, 2017

(54) METHOD OF MANUFACTURING 3D BARRIER SUBSTRATE

(71) Applicants: BOE TECHNOLOGY GROUP CO., LTD., Beijing (CN); BEIJING BOE DISPLAY TECHNOLOGY CO., LTD., Beijing (CN)

(72) Inventors: Huibin Guo, Beijing (CN); Shoukun Wang, Beijing (CN); Xiaowei Liu, Beijing (CN); Xiaming Zhu, Beijing (CN); Zongjie Guo, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 198 days.

(21) Appl. No.: 14/353,792

(22) PCT Filed: Dec. 17, 2013

(86) PCT No.: PCT/CN2013/089646
§ 371 (c)(1),
(2) Date: Apr. 24, 2014

(87) PCT Pub. No.: WO2015/000272
PCT Pub. Date: Jan. 8, 2015

(65) Prior Publication Data
US 2015/0194660 A1    Jul. 9, 2015

(30) Foreign Application Priority Data
Jul. 2, 2013   (CN) .......................... 2013 1 0275057

(51) Int. Cl.
*H01K 3/10*     (2006.01)
*H01M 4/02*    (2006.01)
(Continued)

(52) U.S. Cl.
CPC ........... *H01M 4/02* (2013.01); *H01M 4/0404* (2013.01); *H05K 1/0284* (2013.01);
(Continued)

(58) Field of Classification Search
CPC ...... H05K 1/09; H05K 1/0296; H05K 1/0284; H05K 2201/10136; H05K 1/115;
(Continued)

(56) References Cited

U.S. PATENT DOCUMENTS 6,809,335 B2 * 10/2004 Park ................. G02F 1/136213
                                                     257/59
6,833,666 B2 * 12/2004 Seo .................. H01L 29/66757
                                                     313/509
(Continued)

FOREIGN PATENT DOCUMENTS

CN        1503373 A     6/2004
CN        1726600 A     1/2006
(Continued)

OTHER PUBLICATIONS

Second Office Action for corresponding Chinese Application No. CN 201310275057.8; dated Mar. 25, 2015; 6 pages.
(Continued)

*Primary Examiner* — Donghai D Nguyen
(74) *Attorney, Agent, or Firm* — Brooks Kushman P.C.

(57) ABSTRACT

An embodiment of the present invention discloses a 3D barrier substrate and a method for manufacturing the same, and a display device in order to improve the utilization of facilities, increase the production efficiency, and decrease the cost of production. The method of manufacturing 3D barrier substrate comprises: forming a transparent electrode thin film on a substrate, and forming a passivation layer on the transparent electrode thin film; forming an transparent electrode and a passivation layer via hole by a patterning
(Continued)

process, wherein the via hole is used for coupling the transparent electrode to the signal line; and forming a signal line, wherein the signal line is coupled to the transparent electrode through the via hole.

9 Claims, 8 Drawing Sheets

(51) Int. Cl.
*H01M 4/04* (2006.01)
*H05K 1/02* (2006.01)
*H05K 1/09* (2006.01)
*G02F 1/1362* (2006.01)
*B33Y 10/00* (2015.01)
*B33Y 80/00* (2015.01)
*H05K 1/11* (2006.01)
*G02B 27/22* (2006.01)
*H05K 1/03* (2006.01)
*H05K 3/06* (2006.01)

(52) U.S. Cl.
CPC .......... *H05K 1/0296* (2013.01); *H05K 1/09* (2013.01); *B33Y 10/00* (2014.12); *B33Y 80/00* (2014.12); *G02B 27/2214* (2013.01); *G02F 1/136286* (2013.01); *H05K 1/0306* (2013.01); *H05K 1/115* (2013.01); *H05K 3/064* (2013.01); *H05K 2201/0108* (2013.01); *H05K 2201/0326* (2013.01); *H05K 2201/10136* (2013.01)

(58) Field of Classification Search
CPC ......... H05K 2201/0326; H05K 1/0306; H05K 3/064; H05K 2201/0108; H01M 4/0404; H01M 4/02; G02F 1/136286; G02B 27/2214; B33Y 80/00; B33Y 10/00; Y10T 26/49156

USPC .............. 29/830, 846, 847, 852; 257/59, 72; 313/506, 509
See application file for complete search history.

(56) References Cited

U.S. PATENT DOCUMENTS

| 7,206,049 | B2 | 4/2007 | Song |
| 7,964,903 | B2 | 6/2011 | Joo et al. |
| 8,305,538 | B2 | 11/2012 | Tanaka et al. |
| 8,502,945 | B2* | 8/2013 | Tai ..................... H01L 27/1214 349/141 |
| 2010/0267197 | A1 | 10/2010 | Shieh et al. |
| 2014/0070239 | A1 | 3/2014 | Yang et al. |

FOREIGN PATENT DOCUMENTS

| CN | 101089707 A | 12/2007 |
| CN | 101556417 A | 10/2009 |
| CN | 101752319 A | 6/2010 |
| CN | 101846858 A | 9/2010 |
| CN | 102651342 A | 8/2012 |
| CN | 103383925 A | 11/2013 |
| CN | 203312295 U | 11/2013 |

OTHER PUBLICATIONS

Second Office Action for corresponding Chinese Application No. CN 201310275057.8; dated Mar. 25, 2015; 3 pages—[English Translation].
International Search Report and Written Opinion for corresponding Chinese Application No. PCT/CN2013/089646; dated Mar. 27, 2014; 13 pages.
Chinese First Office Action Dated Oct. 16, 2014, Application No. 201310275057.8, Applicant BOE Technology Group Co., Ltd; Beijing BOE Display Technology Co., Ltd., 6 Pages.

* cited by examiner

METHOD OF MANUFACTURING 3D BARRIER SUBSTRATE

CROSS-REFERENCE TO RELATED APPLICATION

This application is the U.S. national phase of PCT Application No. PCT/CN2013/089646 filed on Dec. 17, 2013, which claims priority to Chinese Patent Application No. 201310275057.8 filed on Jul. 2, 2013, the disclosures of which are incorporated in their entirety by reference herein.

TECHNICAL FIELD

The present invention relates to the field of a display technique, in particular to a 3D barrier substrate, the method of manufacturing the same, and a display device.

BACKGROUND

In the prior art, the method of manufacturing a 3D barrier substrate comprises the steps as follows.

Referred to FIGS. 1(a) and 1(b), a signal line metal layer is deposited on the whole glass substrate 10, and a pattern of a first mask is formed on a photo-resist layer by performing the first coating, exposing and developing, and a signal line metal electrode 11 is formed by performing the first etching and removing the photo-resist, wherein the signal line metal electrode 11 is a ring shape electrode.

Referred to FIGS. 2(a) and 2(b), a passivation layer 21 is deposited on the whole glass substrate 10, a pattern of a second mask is formed on the photo-resist layer by performing the second coating, exposing and developing, and a passivation layer 21 is formed by performing the second etching to remove the passivation layer on the signal line metal layer and remove the photo-resist, and a square shape via hole 22 is formed on the signal line metal electrode 11.

Referred to FIGS. 3 (a) and 3(b), a transparent conductive layer 31 is deposited on the whole glass substrate 10, the transparent conductive layer is generally an ITO layer. A pattern of a third mask is formed on the photo-resist layer by performing the third coating, exposing and developing, and ITO electrodes which are alternately arranged are formed by performing the third etching and removing the photo-resist. The ITO electrode is a stripe shape electrode and the ITO electrode 31 is coupled to the signal line metal electrode 11 through the square shape via hole 22.

The above-described method of manufacturing a 3D barrier substrate may ensure that the ring shape signal line metal electrode 11 charges the stripe shape ITO transparent electrode 31 respectively, and the design requirements for a 3D barrier substrate are met To sum up, in the prior art, the method of manufacturing a 3D barrier substrate need to perform a photo etching process for three times and adopts a three-layer structure comprising a signal line metal layer, a passivation layer, and an ITO transparent conducting layer, and each of which need to design a mask respectively, so many procedures decreases the production efficiency and increases the cost of production.

SUMMARY

An embodiment according to the present invention provides a 3D barrier substrate, a method of manufacturing the same, and a display device to improve the utilization of facilities, increase the production efficiency, and decrease the cost of production.

An embodiment according to the present invention provides a method of manufacturing a 3D barrier substrate comprising:

forming a transparent electrode thin film on a substrate, and forming a passivation layer on the transparent electrode thin film;

forming an transparent electrode and a passivation layer via hole by a patterning process, wherein the via hole is used for coupling the transparent electrode to a signal line; and forming the signal line, wherein the signal line is coupled to the transparent electrode through the via hole.

An embodiment according to the present invention provides a 3D barrier substrate comprising: a substrate, a transparent electrode on the substrate, a passivation layer on the transparent electrode layer, and a signal line on the passivation layer, wherein the signal line is coupled to the transparent electrode through a via hole on the passivation layer.

An embodiment according to the present invention provides a display device comprising the above-described 3D barrier substrate.

To sum up, among the technical solutions provided by the embodiments of the present invention, the method of manufacturing a 3D barrier substrate comprises: forming a transparent electrode thin film on a substrate, and forming a passivation layer on the transparent electrode thin film; forming an transparent electrode and a passivation layer via hole by a patterning process, wherein the via hole is used for coupling the transparent electrode to the signal line; and forming a signal line, wherein the signal line couples to the transparent electrode through the via hole. The method provided by the embodiment of the present invention adopts two times patterning process, decreases the cost of producing the mask, reduces one time exposure process, shortens the process procedure, improves the utilization of facilities, increases the production efficiency, and decreases the cost of production

DETAILED DESCRIPTION

An embodiment of the present invention provides a 3D barrier substrate and a method of manufacturing the same, and a display device to improve the utilization of facilities, increases the production efficiency, and decrease the cost of production The details of the technical solutions provided by the embodiments of present invention are described as follows.

Figure 1:
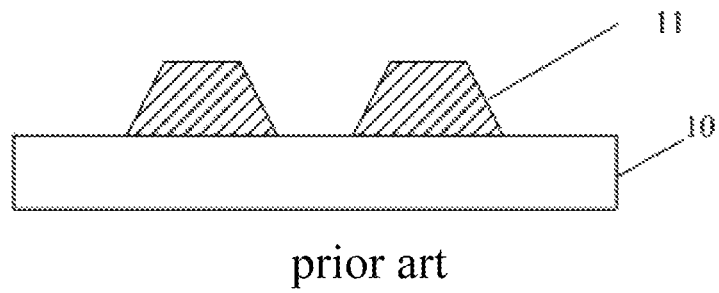
FIGS. 1(a) and 1(b) are a cross-section diagram and a front-view diagram of a signal line metal electrode manufactured in the prior art respectively.
Figure 1:
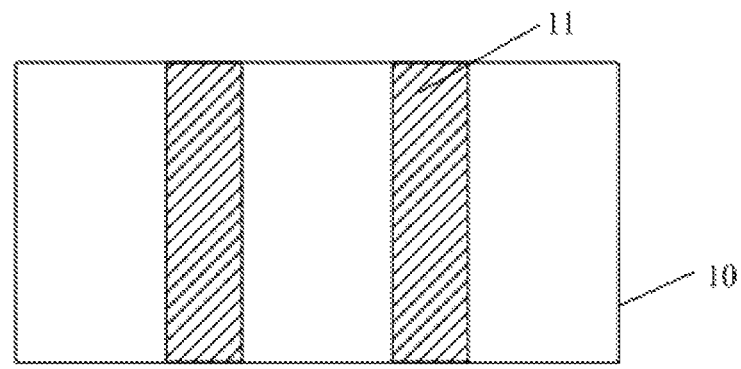
Figure 2:
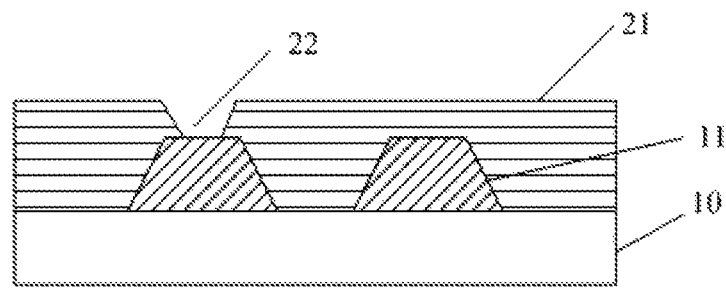
FIGS. 2(a) and 2(b) are a cross-section diagram and a front-view diagram of the passivation layer manufactured on the basis of FIG. 1 in the prior art respectively.
Figure 2:
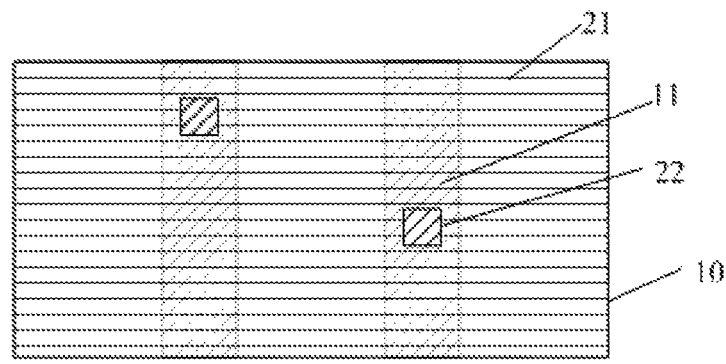
Figure 3:
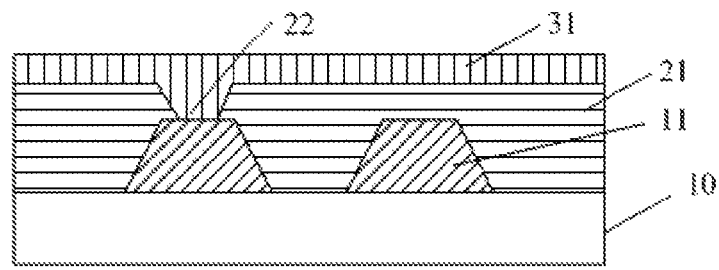
FIGS. 3(a) and 3(b) are a cross-section diagram and a front-view diagram of the ITO electrode manufactured on the basis of FIG. 2 in the prior art respectively.
Figure 3B:
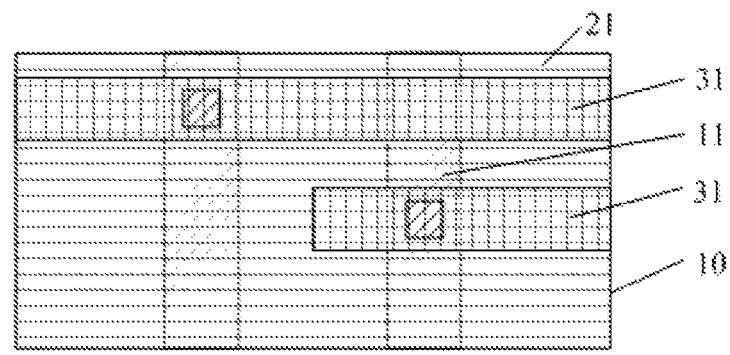
Figure 4:
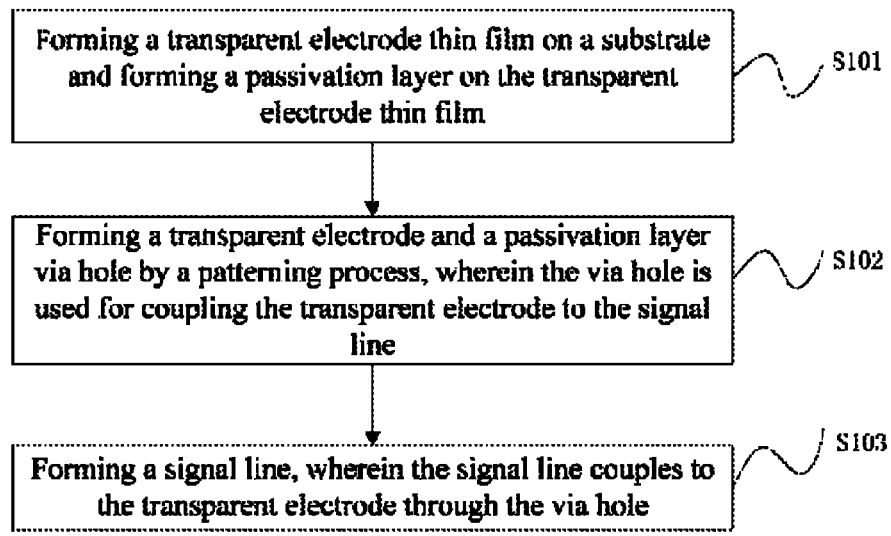
FIG. 4 is a flowchart showing the method of manufacturing a 3D barrier substrate according to an embodiment of the present invention.

Referred to FIG. 4, the method of manufacturing a 3D barrier substrate provided by an embodiment of the present invention comprises following steps:

S101: forming a transparent electrode thin film on a substrate, and forming a passivation layer on the transparent electrode thin film;

S102: forming a transparent electrode and a passivation layer via hole by a patterning process, and the via hole being used to couple the transparent electrode to a signal line;

It is appreciated that the patterning process may comprise a part or all processes of masking, exposing, developing, photo-etching, etching and so on which are required to form a pattern, and may also comprise ashing and annealing and so on.

For example, forming a pattern of a gate electrode on the substrate by a patterning process comprises: firstly, depositing a gate electrode layer on the substrate; then coating the photo-resist, and exposing and developing the photo-resist using a mask so as to form a photo-resist pattern; then, removing a corresponding electrode layer by etching process and so on by using the photo-resist pattern as an etching mask, and removing the residual photo-resist; and finally forming the gate electrode pattern on the substrate.

S103: forming the signal line which is coupled to the transparent electrode through a via hole.

Preferably, the patterning process comprises: a part or all processes of a photo etching process of coating a photo-resist on the passivation layer and then exposing and developing, a etching process after photo-etching, and a process of removing the photo-resist after etching.

Preferably, when a transparent electrode and a passivation layer via hole are formed by the patterning process, after exposing and developing the photo-resist coated on the passivation layer by a halftone technique, the photo-resist layer coated on the passivation layer comprises: a first photo-resist layer which coats a region where the transparent electrode is to be formed, a second photo-resist layer which coats a region where the via hole is to be formed, the via hole is used to couple the transparent electrode to the signal line, and the thickness of the first photo-resist layer is larger than that of the second photo-resist layer.

Preferably, the process of forming the via hole comprises: etching the passivation layer which is not coated by the photo-resist, removing the second photo-resist layer, forming the transparent electrode by etching the revealed transparent electrode layer, and forming the via hole by etching the passivation layer that is formerly coated by the second photo-resist layer.

Preferably, the thickness of the first photo-resist layer is in the range of 1.5-3 μm, and the thickness of the second photo-resist layer is in the range of 0.5-1 μm.

Preferably, when removing the second photo-resist layer, the photo-resist having the thickness of 0.5-1 μm is removed from the first photo-resist layer.

Preferably, the second photo-resist layer is removed by an ashing process.

Preferably, the process of forming the transparent electrode by etching the revealed transparent electrode layer comprises: performing over-etching when the revealed transparent electrode layer is etched, and the transparent electrode formed after over-etching has an indentation with a size of 0.5-2 μm relative to the passivation layer coating the transparent electrode so that the signal line may be only coupled to the transparent electrode through the via hole.

Preferably, the process of forming the signal line comprises: depositing a signal line metal layer, coating a third photo-resist layer on the signal line metal layer, and forming a pattern which is required by the signal line on the third photo-resist layer by exposing and developing, etching the signal line metal layer which is not coated by the third photo-resist layer, and forming the signal line by removing the third photo-resist layer.

The embodiments will be described in detail.

Figure 5:
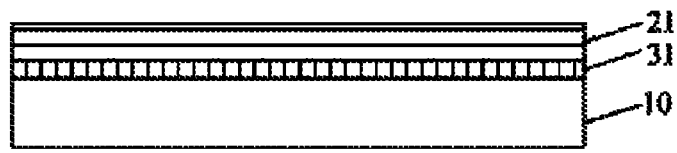
FIGS. 5(a) and 5(b) are a cross-section diagram and a front-view diagram of the ITO layer and the passivation layer after depositing according to an embodiment of the present invention respectively.
Figure 5:
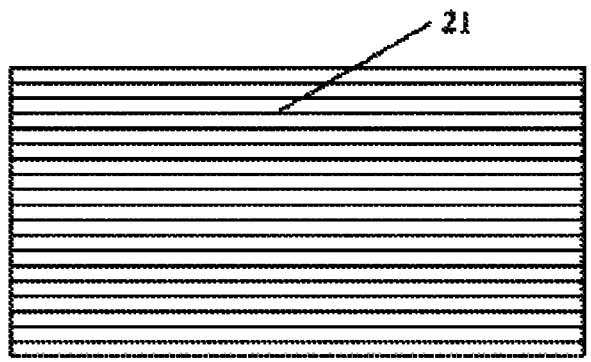

As shown in FIGS. 5(*a*) and 5(*b*), firstly, the transparent conductive layer 31 and the passivation layer 21 are sequentially deposited on the substrate 10, wherein the substrate 10 is a glass substrate, the transparent electrode layer 31 is an ITO transparent conductive thin film layer. The ITO layer 31 and the passivation layer 21 are deposited in a low temperature by sputtering, wherein the deposition temperature is between a room temperature to 50° C., the deposition thickness of the ITO layer 31 is about between 400 to 800 Å, the deposition thickness of the passivation layer 21 is about between 2000 to 6000 Å. Furthermore, the ITO layer 31 may be deposited by a method of electron beam evaporation and so on, and the passivation layer 21 may be deposited by a method of Plasma Chemical Vapor Deposition (PCVD) and so on.

The detail of forming the transparent electrode and the passivation layer via hole by a patterning process is described as follows.

Figure 6A:
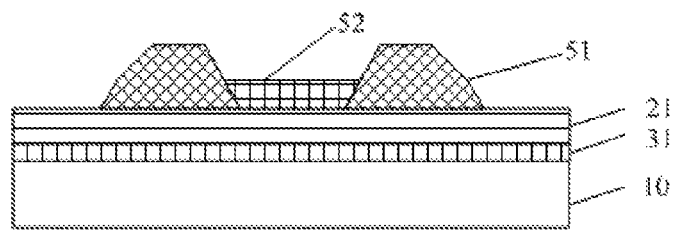
FIGS. 6(a) and 6(b) are a cross-section diagram and a front-view diagram of a first photo-resist layer and a second photo-resist layer manufactured by coating the photo-resist and exposing and developing the photo-resist with a half exposure mask on the basis of FIG. 5 according to an embodiment of the present invention.
Figure 6:
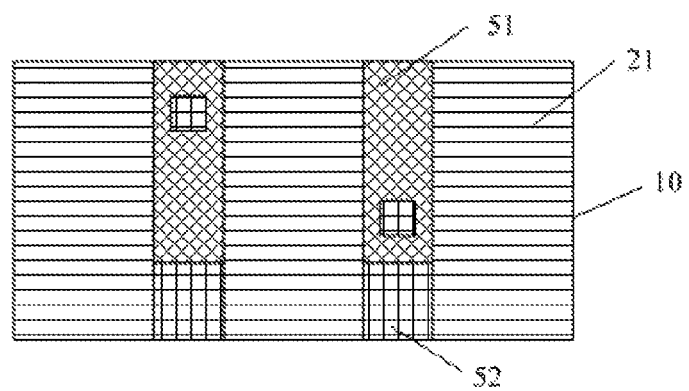

As shown in FIGS. 6(*a*) and 6(*b*), the photo-resist is coated on the passivation layer 21 evenly, the first photo-resist layer 51 and the second photo-resist layer 52 are formed on the passivation layer after the photo-resist is exposed and developed using a half exposure mask, wherein the first photo-resist layer 51 coats a region where the ITO electrode pattern is required to be formed, and the second photo-resist layer 52 coats a region where the via hole coupling the ITO electrode to the signal line is required to be formed, and the thickness of the first photo-resist layer 51 is larger than that of the second photo-resist layer 52. In an embodiment of the present invention, the thickness of the first photo-resist layer 51 is in a range of about 1.5-3 μm, and the thickness of the second photo-resist layer 52 is in a range of about 0.5-1 μm. However, the thickness of the first photo-resist layer 51 and the thickness of the second photo-resist layer 52 are not limited to the values presented in this invention, and may be adjusted according to an actual process. Wherein in the subsequent etching process, in the region which is not coated by the photo-resist, the ITO layer and the passivation layer are completely etched. In the subsequent etching process, in the region which is coated by the second photo-resist layer 52, the ITO layer 31 is kept and the passivation layer is completely etched. In the subsequent etching process, in the region that is coated by the first photo-resist layer 51, the passivation layer 21 and the ITO layer 31 are kept.

Figure 7:
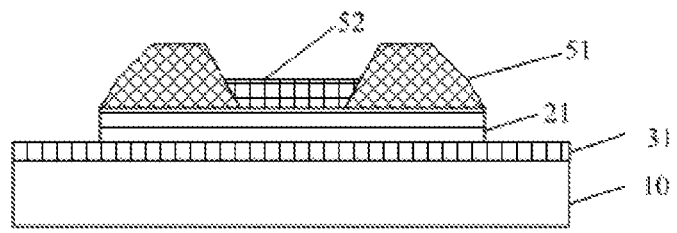
FIGS. 7(a) and 7(b) are a cross-section diagram and a front-view diagram after etching the passivation layer which is not coated by the photo-resist on the basis of FIG. 6 according to an embodiment of the present invention.
Figure 7:
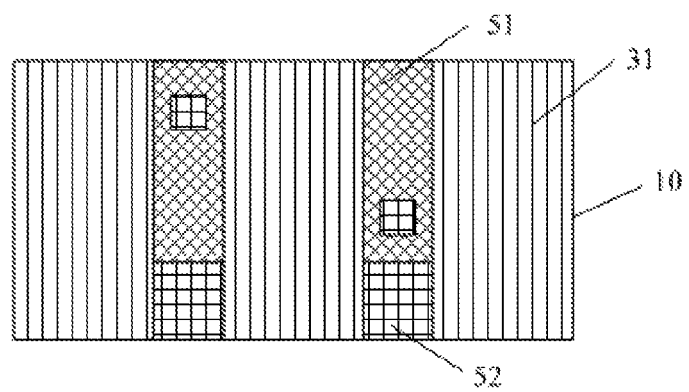

As shown in FIGS. 7(*a*) and 7(*b*), the passivation layer which is not coated by the photo-resist is etched and removed by dry etching so as to reveal the ITO layer 31 under the passivation layer 21.

Figure 8:
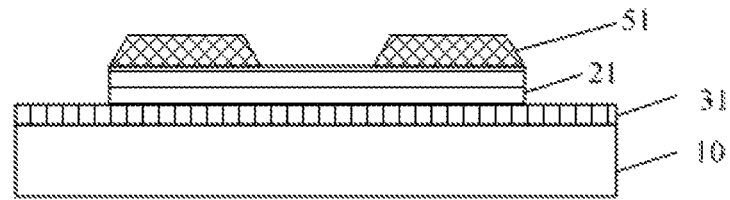
FIGS. 8(*a*) and 8(*b*) are a cross-section diagram and a front-view diagram after removing the second photo-resist layer on the basis of FIG. 7 according to an embodiment of the present invention.
Figure 8:
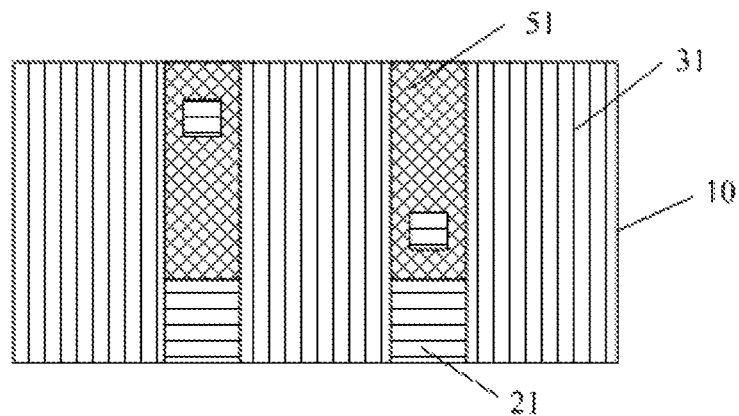

As shown in FIGS. 8(*a*) and 8(*b*), the second photo-resist layer is removed by an ashing and photo-resist removing process so as to reveal the passivation layer 21 coated by the second photo-resist layer, and the first photo-resist layer 51 becomes thinner during this process, such as the thickness of the first photo-resist layer 51 is reduced by 0.5-1 μm.

Figure 9:
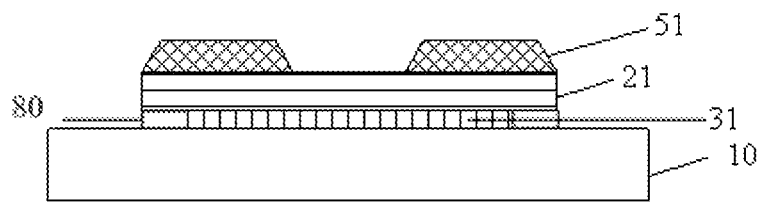
FIGS. 9(*a*) and 9(*b*) are a cross-section diagram and a front-view diagram of the ITO electrode manufactured on the basis of FIG. 8 according to an embodiment of the present invention.
Figure 9:
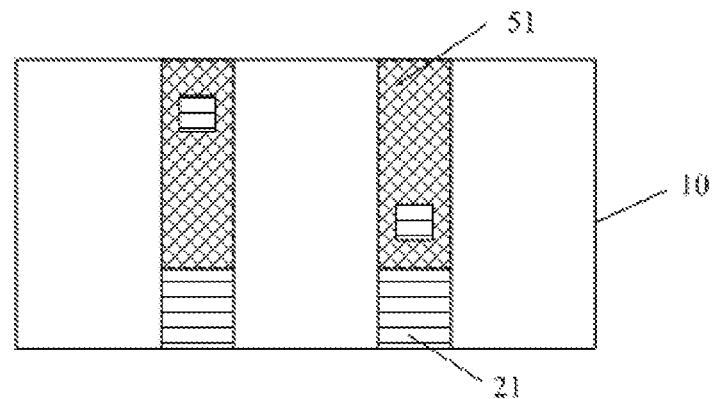

As shown in FIGS. 9(*a*) and 9(*b*), the revealed ITO layer is etched by wet etching so as to form the desirable ITO electrode pattern 31. Wherein the ITO layer which is coated by the first photo-resist layer 51 and the passivation layer 21 is not etched.

Preferably, over-etching is required during the etching process. After over-etching, the ITO layer 31 has an indentation region 80 with a size of 0.5-2 μm relative to the passivation layer 21 coating the ITO layer 31 so that the ITO layer 31 and the metal layer are not electrically connected when depositing the metal layer subsequently.

Figure 10:
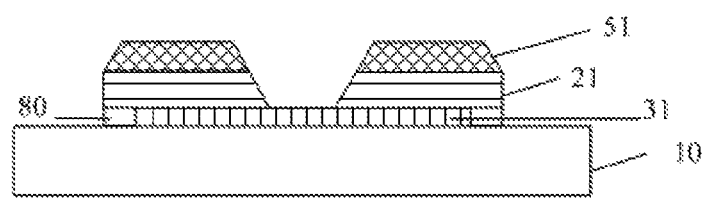
FIGS. 10(*a*) and 10(*b*) are a cross-section diagram and a front-view diagram after etching the passivation layer which is formerly coated by the second photo-resist layer on the basis of FIG. 9 according to an embodiment of the present invention.
Figure 10:
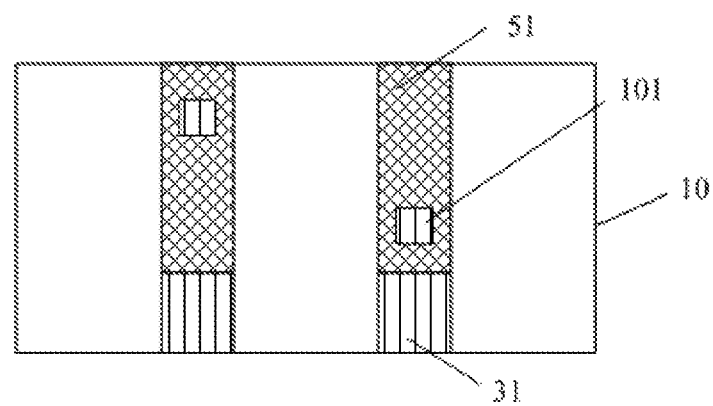

As shown in FIGS. 10(*a*) and 10(*b*), the revealed passivation layer which is not coated by the photo-resist is etched by the second dry-etching so as to form the via hole 101 and reveal the ITO electrode 31, wherein the revealed ITO electrode 31 is located in the display area of the substrate.

Figure 11:
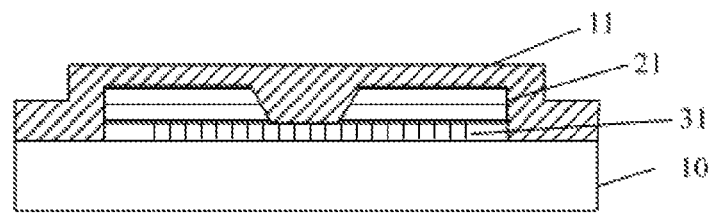
FIGS. 11(*a*) and 11(*b*) are a cross-section diagram and a front-view diagram after removing the first photo-resist layer and depositing the signal line metal electrode on the basis of FIG. 10 according to an embodiment of the present invention.
Figure 11:
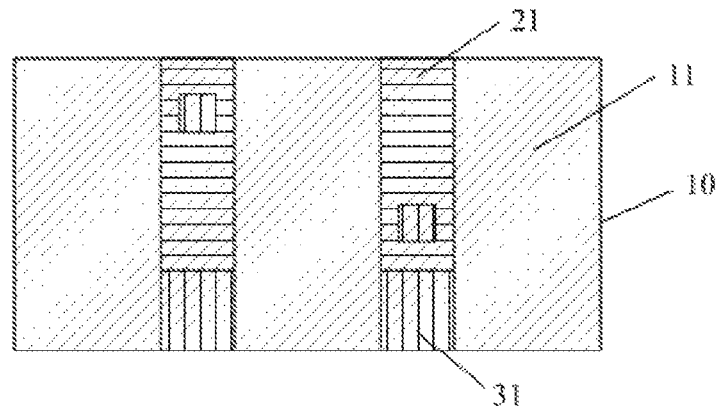

As shown in FIGS. 11(*a*) and 11(*b*), the first photo-resist layer is removed and the ITO layer 31 is annealed. The conditions of annealing are: in the protective gas such as $N_2$, $O_2$ and so on, the temperature of annealing is in a range of 250° C.-300° C., and the time period of annealing is in a range of 15-30 minutes. Wherein conditions of annealing are not limited to the conditions of annealing provided by the embodiment of the present invention. The conditions such as temperature of annealing, the time period of annealing and so on can be properly adjusted according to the actual process.

Then, the signal line metal layer 11 which has a thickness about 2000-5000 Å is deposited by sputtering, wherein the signal line metal layer 11 may also be deposited by other methods such as electron beam evaporation and so on.

The signal line is formed by the second patterning process, and the signal line may be only coupled to the transparent electrode through the via hole. Certainly, the second patterning process may be not exactly the same as the preceding patterning process. For example, the detail of the second patterning process may be described as following.

Figure 12:
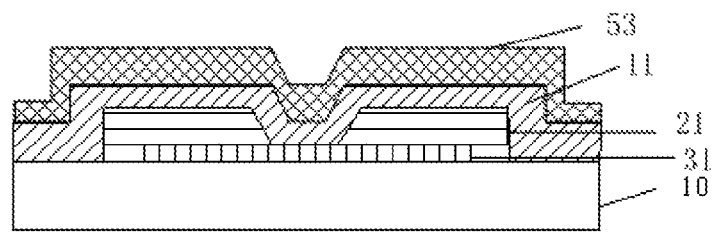
FIGS. 12(*a*) and 12(*b*) are a cross-section diagram and a front-view diagram after coating the third photo-resist layer on the signal line metal electrode and then exposing and developing on the basis of FIG. 11 according to an embodiment of the present invention.
Figure 12:
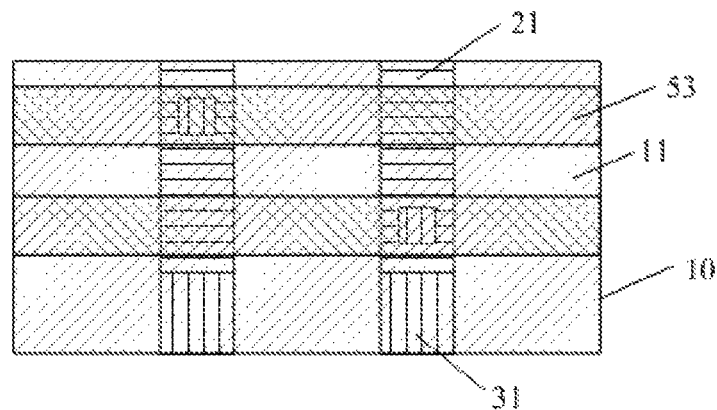

As shown in FIGS. 12(*a*) and 12(*b*), a third photo-resist layer 53 is coated on the signal line metal layer 11, and after exposing and developing, the pattern on the third photo-resist layer 53 is formed as required by the signal line 11. In the region where the third photo-resist layer 53 is coated, the signal line metal layer 11 is kept in the subsequent etching process.

Figure 13:
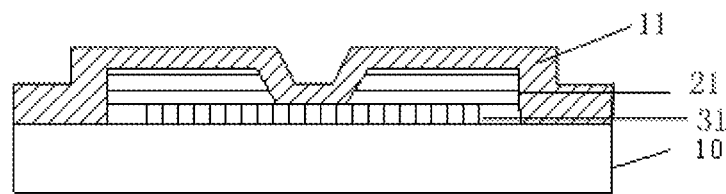
FIGS. 13(*a*) and 13(*b*) are a cross-section diagram and a front-view diagram of the signal line metal electrode manufactured on the basis of FIG. 12 according to an embodiment of the present invention.
Figure 13:
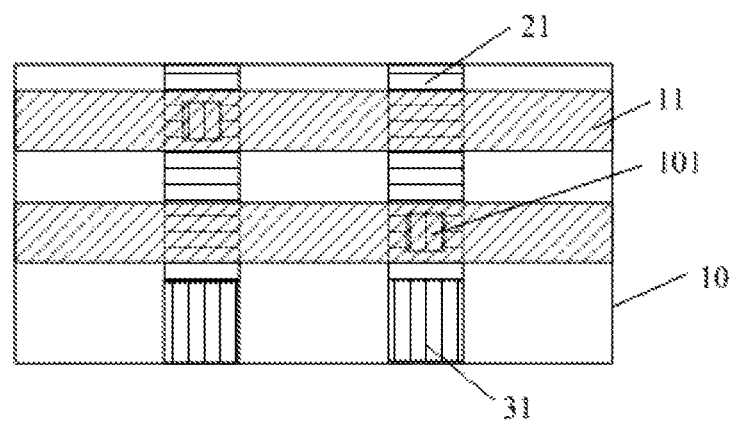

As shown in FIGS. 13(*a*) and 13(*b*), the signal line metal layer which is coated by the third photo-resist layer 53 is etched by wet-etching, and then the third photo-resist layer 53 is removed by a striping method so as to form the required signal line 11. In the display area of the substrate, the ITO electrode lines 31 having different functionalities are coupled to the corresponding signal lines 11 respectively through the via holes so that the same signal is applied to the alternately arranged ITO electrode lines 31.

An embodiment of the present invention provides a 3D barrier substrate comprising: a substrate, a transparent electrode on the substrate, a passivation layer on the transparent electrode layer, and a signal line on the passivation layer, wherein the signal line is coupled to the transparent electrode through the via hole on the passivation layer.

Preferably, the transparent electrode, which is revealed at the position of the via hole on the passivation layer, is in the display area of the substrate.

Preferably, the transparent electrodes are alternately arranged transparent electrodes.

Preferably, the signal line is a ring shape signal line, and the transparent electrode is a strip shape transparent electrode.

Preferably, the transparent electrode is an Indium Tin Oxide transparent electrode.

An embodiment of the present invention provides a display device comprising the 3D barrier substrate, wherein the display device may be a liquid crystal display (LCD) or a naked-eye 3D display.

To sum up, among the technical solutions provided by the embodiments of the present invention, the method of manufacturing a 3D barrier substrate comprises: forming a transparent electrode thin film on a substrate, and forming a passivation layer on the transparent electrode thin film; forming an transparent electrode and a passivation layer via hole by a patterning process, wherein the via hole is used for coupling the transparent electrode to the signal line; and forming a signal line, wherein the signal line couples to the transparent electrode through the via hole. The method provided by the embodiment of the present invention adopts two times patterning process, decreases the cost of producing the mask, reduces one time exposure process, shortens the process procedure, improves the utilization of facilities, increases the production efficiency, and decreases the cost of production.

It should be noted that, those of ordinary skills in the art may further make improvements and modifications without departing from the principle of the present invention, and these improvements and modifications shall also be considered as the scope of the present invention.

What is claimed is:
1. A method for manufacturing a three-dimensional (3D) barrier substrate, comprising:
    forming a transparent electrode thin film on a substrate, and forming a passivation layer on the transparent electrode thin film;

forming a transparent electrode and a passivation layer via hole by a patterning process, wherein the via hole is used for coupling the transparent electrode to a signal line; and forming the signal line, wherein the signal line is coupled to the transparent electrode through the via hole, wherein during forming the transparent electrode and the passivation layer via hole by the patterning process, after exposing and developing photo-resistant coated on the passivation layer by a halftone technique, the photo-resist layer coated on the passivation layer comprises a first photo-resistant layer and a second photo-resist layer, the first photo-resist layer coats a region where a transparent electrode pattern is to be formed, and the second photo-resist layer coats a region where the via hole is to be formed, the via hole is used to couple the transparent electrode to the signal line, and the thickness of the first photo-resist layer is larger than that of the second photo-resist layer.

2. The method according to claim 1, wherein the patterning process comprises:

a part or all processes of a photo etching process of coating photo-resist on the passivation layer and then exposing and developing the photo-resist, an etching process after photo-etching, and a process of removing the photo-resist after etching.

3. The method according to claim 1, wherein the process of forming the via hole comprises:

etching the passivation layer which is not coated by the photo-resist, removing the second photo-resist layer, forming the transparent electrode by etching the revealed transparent electrode layer, and forming the via hole by etching the passivation layer that is formerly coated by the second photo-resist layer.

4. The method according to claim 3, wherein, when removing the second photo-resist layer, the photo-resist having the thickness of 0.5-1 μm is removed from the first photo-resist layer.

5. The method according to claim 3, wherein
the second photo-resist layer is removed by an ashing process.

6. The method according to claim 3, wherein
the process of forming the transparent electrode by etching the revealed transparent electrode layer comprises:

performing over-etching when the revealed transparent electrode layer is etched, and the transparent electrode formed after over-etching has an indentation relative to the passivation layer coating the transparent electrode, so that the signal line is only coupled to the transparent electrode through the via hole.

7. The method according to claim 6, wherein the indentation has a size of 0.5-2 μm.

8. The method according to claim 1, wherein
the thickness of the first photo-resist layer is in the range of 1.5-3 μm, and the thickness of the second photo-resist layer is in the range of 0.5-1 μm.

9. The method according to claim 1, wherein forming the signal line comprises:

depositing a signal line metal layer, coating a third photo-resist layer on the signal line metal layer, and forming a pattern which is required by the signal line on the third photo-resist layer by exposing and developing, etching the signal line metal layer which is not coated by the third photo-resist layer, and forming the signal line by removing the third photo-resist layer.

* * * * *

UNITED STATES PATENT AND TRADEMARK OFFICE
CERTIFICATE OF CORRECTION

PATENT NO. : 9,590,231 B2
APPLICATION NO. : 14/353792
DATED : March 7, 2017
INVENTOR(S) : Huibin Guo et al.

It is certified that error appears in the above-identified patent and that said Letters Patent is hereby corrected as shown below:

Column 7, Line 9, Claim 1:
After "and developing"
Delete "photo-resistant" and
Insert -- photo-resist --.

Column 7, Line 12, Claim 1:
After "and developing"
Delete "photo-resistant" and
Insert -- photo-resist --.

Signed and Sealed this
Nineteenth Day of September, 2017

Joseph Matal
*Performing the Functions and Duties of the*
*Under Secretary of Commerce for Intellectual Property and*
*Director of the United States Patent and Trademark Office*